(12) United States Patent
Choi et al.

(10) Patent No.: US 12,275,867 B2
(45) Date of Patent: Apr. 15, 2025

(54) ADHESIVE TAPE FOR SEMICONDUCTOR PACKAGE MANUFACTURING PROCESS AND METHOD FOR MANUFACTURING SAME

(71) Applicant: MODU TECH CO., LTD., Gyeonggi-do (KR)

(72) Inventors: Byeong Yeon Choi, Gyeonggi-do (KR); Seung Yol Lee, Gyeonggi-do (KR); Suk Hee Kang, Gyeonggi-do (KR); Gyung Ju Yoon, Gyeonggi-do (KR)

(73) Assignee: MODU TECH CO., LTD., Gyeonggi-do (KR)

( * ) Notice: Subject to any disclaimer, the term of this patent is extended or adjusted under 35 U.S.C. 154(b) by 212 days.

(21) Appl. No.: 17/922,873

(22) PCT Filed: May 14, 2021

(86) PCT No.: PCT/KR2021/006070
§ 371 (c)(1),
(2) Date: Nov. 2, 2022

(87) PCT Pub. No.: WO2021/246680
PCT Pub. Date: Dec. 9, 2021

(65) Prior Publication Data
US 2023/0159800 A1    May 25, 2023

(30) Foreign Application Priority Data
Jun. 5, 2020 (KR) .................. 10-2020-0068064

(51) Int. Cl.
*H01L 21/68* (2006.01)
*C09J 133/08* (2006.01)
(Continued)

(52) U.S. Cl.
CPC .......... *C09J 133/08* (2013.01); *C09J 133/12* (2013.01); *C09J 183/04* (2013.01);
(Continued)

(58) Field of Classification Search
CPC ................... H01L 21/6836; H01L 2221/6834
See application file for complete search history.

(56) References Cited

U.S. PATENT DOCUMENTS

2014/0017491 A1   1/2014  Wouters et al.
2016/0293553 A1  10/2016  Han et al.
(Continued)

FOREIGN PATENT DOCUMENTS

CN    110191933 A    8/2019
CN    110527484 A   12/2019
(Continued)

OTHER PUBLICATIONS

Yan Yue et al., "New Progress in the application of transparent materials in aviation cockpit", National Defense Industry Press, Nov. 31, 2011, pp. 115-116.
(Continued)

*Primary Examiner* — Jeffry H Aftergut
(74) *Attorney, Agent, or Firm* — IP Legal Services, LLC

(57) ABSTRACT

The present disclosure relates to an adhesive tape for a semiconductor manufacturing process, the adhesive tape being attached on a lower surface of a semiconductor package on which a plurality of protrusion electrodes are formed. The adhesive tape is configured to include a first base film, a first adhesive layer containing an acrylic-based copolymer, the first adhesive layer being stacked on top of the first base film, a second base film containing a metal material in such a manner as to be deformed and then kept deformed during each process in a manner that corresponds to a topology of the lower surface of the semiconductor
(Continued)

package, the second base film being stacked on top of the first adhesive layer, and a second adhesive layer containing silicon having a spiral network structure, the second adhesive layer being on top of the second base film.

14 Claims, 3 Drawing Sheets

(51) Int. Cl.
    *C09J 133/12*     (2006.01)
    *C09J 183/04*     (2006.01)
    *H01L 21/683*     (2006.01)
    *H01L 23/552*     (2006.01)

(52) U.S. Cl.
    CPC ........ *H01L 21/6836* (2013.01); *H01L 23/552* (2013.01); *C09J 2203/326* (2013.01); *C09J 2301/1242* (2020.08); *C09J 2301/312* (2020.08); *C09J 2301/414* (2020.08); *H01L 2221/6834* (2013.01)

(56) References Cited

U.S. PATENT DOCUMENTS

2020/0006087 A1    1/2020   Yamaguchi et al.
2020/0048501 A1    2/2020   Igarashi et al.

FOREIGN PATENT DOCUMENTS

| | | | |
|---|---|---|---|
| JP | 2002-235051 A | * | 8/2002 |
| JP | 2013-098443 A | | 5/2013 |
| KR | 10-2014-0013039 A | | 2/2014 |
| KR | 10-1501735 B1 | | 3/2015 |
| KR | 10-1662068 B1 | | 10/2016 |
| KR | 10-2019-0008150 A | | 1/2019 |
| KR | 10-2019-0095394 A | | 8/2019 |
| KR | 10-2020-0011647 A | * | 2/2020 |
| KR | 10-2020-0015234 A | | 2/2020 |
| WO | 98/23305 A1 | | 6/1998 |
| WO | 2018/101090 A1 | | 6/2018 |
| WO | WO-2018/199507 A1 | * | 11/2018 |
| WO | 2019/013589 A1 | | 1/2019 |
| WO | 2019/171504 A1 | | 9/2019 |

OTHER PUBLICATIONS

Japan Patent Office, Office Action of corresponding JP Patent Application No. 2022-563029, Dec. 6, 2023.
China National Intellectual Property Administration, Office Action of corresponding CN Patent Application No. 202180032893.6, Aug. 2, 2023.
China National Intellectual Property Administration, Office Action of corresponding CN Patent Application No. 202180032893.6, Jan. 18, 2024.

* cited by examiner

ADHESIVE TAPE FOR SEMICONDUCTOR PACKAGE MANUFACTURING PROCESS AND METHOD FOR MANUFACTURING SAME

CROSS REFERENCE TO RELATED APPLICATIONS

This application is a National Stage Patent Application of PCT International Patent Application No. PCT/KR2021/006070 (filed on May 14, 2021) under 35 U.S.C. § 371, which claims priority to Korean Patent Application No. 10-2020-0068064 (filed on Jun. 5, 2020), the teachings of which are incorporated herein in their entireties by reference.

TECHNICAL FIELD

The present disclosure relates to an adhesive tape for a semiconductor package manufacturing process and, more particularly, to an adhesive tape for a semiconductor package manufacturing process, the adhesive tape capable of effectively protecting a lower surface of a semiconductor package and a plurality of protrusion electrodes formed the lower surface of the semiconductor package during a process of forming an Electromagnetic Interference (EMI) for the semiconductor package.

BACKGROUND ART

A pin grid array (PGA) technique or a lead frame technique was widely used as a technique for terminal contact of a semiconductor package to the outside in the related art. However, in recent years, a ball grid array (BGA) technique has been widely used.

With the BGA technique, the semiconductor package to the outside makes the terminal contact to the outside using multiple protrusion electrodes, that is, solder balls, formed on a bottom surface of the semiconductor package in a protruding manner. Thus, more signals are possibly made to be transmitted with the BGS technique than with the pin gird array (PGA) technique or the lead frame technique in the related art.

Due to its features as mentioned above, the BGA technique has been used for a main type of package for the next-generation high-speed memory, and the use of a chip scale package (CSP) that was limited to a portable information communication device, such as a mobile phone or a digital camera, has been expanded up to the computer or workstation field.

There is an increasing need to reduce the size of a terminal in order to increase the portability of the terminal, such as the mobile phone, in the mobile field. Accordingly, in order to reduce the size of the terminal, there is an increasing need to reduce the size of a printed circuit board (PCB) that is a primary component of the terminal.

However, the reduction in the size of the PCB decreases a gap between semiconductor elements included in the PCB, and thus an error necessarily occurs due to electromagnetic wave interference between the semiconductor elements. In order to suppress the electromagnetic wave interference between elements, methods of placing a cap for element shielding or technologies for forming metal coating for shielding on an external surface of the element using an Electromagnetic Interference (EMI) sputtering technique have been developed and employed. Among these technologies, a technology for coating a shielding metal by sputtering refers to forming of a metal thin film for shielding an electromagnetic wave on an external surface other than a contact terminal of the semiconductor element.

In this regard, Korean Patent Nos. 10-1501735 (Patent Document 1) and 10-1662068 (Patent Document 2) in the related art discloses a method of preventing an effect on a contact terminal during a sputtering process for shielding an electromagnetic wave of a BGA type semiconductor package.

Patent Document 1 relates to a method of processing for EMI shielding for a semiconductor package. The method includes a tap attachment step of attaching an edge of a tape on a lower surface of a frame and thus forming the tape on an inner circumference of the frame; a tape cutting step of forming holes in the tape in such a manner as to be spaced a predetermined distance apart; a semiconductor package adhesive-mounting step of arranging an edge of a lower surface of a semiconductor package on an upper surface of the tape and adhesively mounting the semiconductor packages on the upper surface of the tape in such a manner as to be spaced a predetermined distance apart, in order that a bump formed on the lower surface of the semiconductor is inserted into the hole in the tape; and a coating step of performing coating on the semiconductor package adhered to the upper surface of the tape and on the upper surface of the tape, from above the tape. With the method, five surfaces other than the lower surface of the semiconductor package are coated.

However, in a case where the technology disclosed in Patent Document 1 is employed, a tape cutting step of forming the holes in the tape in such a manner as to be spaced a predetermined distance apart may incur an excessive cost. Moreover, when the semiconductor package is not correctly arranged in the hole in the tape in the semiconductor package adhesive-mounting step, there occurs a problem in that a thin film is defectively deposited when performing metal coating by sputtering for Electromagnetic Interference (EMI) shielding.

DOCUMENTS OF RELATED ART (Patent Document 1) Korean Patent No. 10-1501735 (Registered on Mar. 5, 2015)
(Patent Document 2) Korean Patent No. 10-1662068 (Registered on Sep. 27, 2016)

DISCLOSURE

Technical Problem

Accordingly, the present disclosure has been made keeping in mind the above problems occurring in the related art, an object of the present disclosure is to provide an adhesive tape for a semiconductor package manufacturing process, the adhesive tape having excellent adhesion, retention, remove, and stress characteristics and thus capable of effectively protecting a lower surface of a semiconductor package and a plurality of protrusion electrodes formed on the lower surface of the semiconductor package during a process of forming an EMI shielding layer of the semiconductor package including a plurality of protrusion electrodes.

Another object of the present disclosure is to provide an adhesive tape for a semiconductor package manufacturing process, the adhesive tape in which a first base film contains a plastic material or a metal material and thus, during a process of forming an EMI shielding layer, stress balance is effectively maintained in a manner that corresponds to a topology of a lower surface of a semiconductor package on which a plurality of protrusion electrodes are formed, and a stress characteristic required of the adhesive tape for a semiconductor package manufacturing process is easily secured.

Still another object of the present disclosure is to provide an adhesive tape for a semiconductor package manufacturing process, the adhesive tape in which a first adhesive layer contains an acrylic-based copolymer, and thus has an excellent heat resistance at a high temperature, thereby reducing a degassing phenomenon and suitably supporting deformation of a second base film, in which, as a result, the second base film is prevented from being torn, and, at the same time, although the second base film is torn, the first adhesive layer securely surrounds the torn second base film, thereby effectively protecting a plurality of protrusion electrodes, and in which, consequently, the first adhesive layer has a stronger adhesive force than the second adhesive layer, and after a process of forming an EMI shielding layer is finished, the first adhesive layer is separated from the second adhesive layer when the adhesive tape is separated from a semiconductor package.

Still another object of the present disclosure is to provide an adhesive tape for a semiconductor package manufacturing process, the adhesive tape in which a second base film contains a metal material, and thus, an air bubble that may occur in a first adhesive layer is prevented from being transferred to a second adhesive layer, and in which, when the adhesive tape is attached on a lower surface of a semiconductor package, due to a sufficient retention characteristic, the second base film, after deformed in a manner that corresponds to a topology of the lower surface of the semiconductor package, is capable of being kept deformed during each process.

Still another object of the present disclosure is to provide an adhesive tape for a semiconductor package manufacturing process, the adhesive tape in which a second adhesive layer contains silicon having a spiral network structure, and thus, respective regions of a lower surface of a semiconductor package and a protrusion electrode that are brought into contact with each other have a sufficient adhesion characteristic, and in which, although an air gap occurs, the air gap is prevented from being excessively expanded during each process in a vacuum state.

Technical Solution

According to an aspect of the present disclosure, an adhesive tape for a semiconductor package manufacturing process, the adhesive tape being attached on a lower surface of a semiconductor package on which a plurality of protrusion electrodes are formed, the adhesive tape includes: a first base film; a first adhesive layer containing an acrylic-based copolymer, the first adhesive layer being stacked on top of the first base film; a second base film containing a metal material in such a manner as to be deformed and then kept deformed during each process in a manner that corresponds to a topology of the lower surface of the semiconductor package, the second base film being stacked on top of the first adhesive layer; and a second adhesive layer containing silicon having a spiral network structure, the second adhesive layer being on top of the second base film.

In the adhesive tape, the first base film may contain a plastic material or a metal material.

In the adhesive tape, the first base film may be a single layer that is formed of one of polyethylene terephthalate, polyimide, and polyolefin or may have a multi-layer structure in which two or more layers, formed of two or more, respectively, of polyethylene terephthalate, polyimide, and polyolefin, are stacked on top of each other, the first base film having a thickness of 10 μm to 150 μm.

In the adhesive tape, the first base film may contain at least 99 wt % or more of aluminum (Al) and may have a tensile strength of 4.8 kgf/mm$^2$ to 14.4 kgf/mm$^2$, an elongation of 6.4% to 19.2%, and a thickness of 20 μm to 80 μm, or the first base film may contain at least 99 wt % or more of copper (Cu) and may have a tensile strength of 8 kgf/mm$^2$ to 31.2 kgf/mm$^2$, an elongation of 3.2% to 14.4%, and a thickness of 20 μm to 80 μm.

In the adhesive tape, the first adhesive layer may contain at least one of a butyl acrylate-butyl methacrylate-methacrylic acid-methyl methacrylate-styrene copolymer, and an acrylic acid-2-ethylhexyl acrylate-2-ethylhexyl methacrylate-glycidyl methacrylate copolymer.

In the adhesive tape, the first adhesive layer may be formed by mixing at least one of 25 to 30 parts by weight of a first adhesive composition containing butyl acrylate-butyl methacrylate-methacrylic acid-methyl methacrylate-styrene copolymer, and 70 to 75 parts by weight of ethyl acetate and 25 to 30 parts by weight of a second adhesive composition containing acrylic acid-2-ethylhexyl acrylate-2-ethylhexyl methacrylate-glycidyl methacrylate copolymer, 50 to 55 parts by weight of toluene, and 15 to 20 parts by weight of ethyl acetate, and an epoxy-based hardener, applying the resulting mixture to the first base film, and then drying and hardening the resulting mixture.

In the adhesive tape, the first adhesive layer may be formed by mixing 80 to 120 parts by weight of the first adhesive composition and 0.5 to 1.5 parts by weight of the epoxy-based hardener, applying the resulting mixture to the first base film, and then drying and hardening the first base film.

In the adhesive tape, the first adhesive layer may be formed by mixing 40 to 60 parts by weight of the first adhesive composition, 40 to 60 parts by weight of the second adhesive composition, and 0.5 to 1.5 parts by weight of the epoxy-based hardener, applying the resulting mixture to the first base film, and drying and hardening the first base film.

In the adhesive tape, the first adhesive layer may have a thickness of 100 μm to 700 μm and an adhesive force of at least more than 500 gf/25 mm, and the second adhesive layer may have a thickness of 10 μm to 50 μm and an adhesive force of 50 gf/25 mm to 500 gf/25 mm.

In the adhesive tape, the more increased a size of the protrusion electrode, the more decreased the thickness of the first adhesive layer may be in a preset thickness range, and the more increased a gap between the protrusion electrodes, the more increased the thickness of the first adhesive layer may be in the preset thickness range, and the more increased the size of the protrusion electrode, the more increased the thickness of the second adhesive layer may be in a preset thickness range, and the more increased the gap between the protrusion electrodes, the more decreased the thickness of the second adhesive layer may be in the preset thickness range.

In the adhesive tape, the second base film may have a thickness of 1 μm to 10 μm.

In the adhesive tape, the second base film may contain at least 99 wt % or more of aluminum (Al) and may have a tensile strength of 4.8 kgf/mm$^2$ to 14.4 kgf/mm$^2$, an elongation of 6.4% to 19.2%, and a thickness of 10 μm to 35 μm, or the second base film may contain at least 99 wt % or more of copper (Cu) and may have a tensile strength of 8 kgf/mm$^2$ to 31.2 kgf/mm², an elongation of 3.2% to 14.4%, and a thickness of 10 μm to 35 μm.

In the adhesive tape, the second adhesive layer may contain a trimethylated silica-dimethyl siloxane copolymer.

According to another aspect of the present disclosure, there is provided a method of manufacturing an adhesive tape for a semiconductor package manufacturing process, the method including: a first tape preparing step of manufacturing a first tape by sequentially stacking a first base film containing a plastic material or a metal material, a first adhesive layer containing an acrylic-based copolymer, and a first release film containing fluorine on top of each other, and manufacturing a second tape by sequentially stacking a second base film containing a metal material, a second adhesive layer containing silicon having a spiral network structure, and a second release film containing fluorine on top of each other; and a first tape lamination step of removing the first release film from the first tape, bringing the first adhesive layer and the second base film into surface contact with each other, and thus laminating the first tape and the second tape on each other.

According to still another aspect of the present disclosure, there is provided a method of manufacturing an adhesive tape for a semiconductor package manufacturing process, the method including: a second tape preparation step of manufacturing a first tape by sequentially stacking a first base film containing a plastic material or a metal material, a first adhesive layer containing an acrylic-based copolymer, and a first release film containing fluorine on top of each other, manufacturing a third tape by depositing the second base film on a third release film using a metal deposition technique, and manufacturing a fourth tape by sequentially stacking a second adhesive layer containing silicon having a spiral network structure and a second release film containing fluorine on top of each other; and a second tape lamination step of removing the first release film from the first tape, then bringing the first adhesive layer and the second base film of the third tape into surface contact with each other, and laminating the first tape and the third tape on each other, and of removing the third release film from the third tape, then bringing a second base film and the second adhesive layer of the fourth tape into surface contact with each other, and laminating the third tape and the fourth tape on each other.

Advantageous Effects

As described above, an adhesive tape for a semiconductor package manufacturing process according to the present disclosure has excellent adhesion, retention, remove, and stress characteristics. Thus, a lower surface of a semiconductor package and a plurality of protrusion electrodes formed on the lower surface of the semiconductor package are effectively protected during a process of forming an EMI shielding layer of a semiconductor package including a plurality of protrusion electrodes.

In addition, in the adhesive tape for a semiconductor package manufacturing process according to the present disclosure, the first base film contains a plastic material or a metal material. Thus, during the process of forming the EMI shielding layer, stress balance is effectively maintained in a manner that corresponds to a topology of the lower surface of the semiconductor package on which the plurality of protrusion electrodes are formed. Moreover, the stress characteristic required of the adhesive tape for a semiconductor package manufacturing process is easily secured.

In addition, in the adhesive tape for a semiconductor package manufacturing process according to the present disclosure, the first adhesive layer contains an acrylic-based copolymer and thus has an excellent heat resistance at a high temperature, thereby reducing a degassing phenomenon and suitably supporting deformation of a second base film. As a result, the second base film is prevented from being torn, and, at the same time, although the second base film is torn, the first adhesive layer securely surrounds the torn second base film, thereby effectively protecting the plurality of protrusion electrodes. Consequently, the first adhesive layer has a stronger adhesive force than the second adhesive layer, and after a process of forming an EMI shielding layer is finished, the first adhesive layer is separated from the second adhesive layer when the adhesive tape is separated from the semiconductor package.

In addition, in the adhesive tape for a semiconductor package manufacturing process according to the present disclosure, the second base film contains a metal material. Thus, an air bubble that may occur in the first adhesive layer is prevented from being transferred to the second adhesive layer. When the adhesive tape is attached on the lower surface of the semiconductor package, due to a sufficient retention characteristic, the second base film, after deformed in a manner that corresponds to the topology of the lower surface of the semiconductor package, is capable of being kept deformed during each process.

In addition, in the adhesive tape for a semiconductor package manufacturing process according to the present disclosure, the second adhesive layer contains silicon having a spiral network structure. Thus, respective regions of the lower surface of the semiconductor package and the protrusion electrode that are brought into contact with each other have a sufficient adhesion characteristic, and, although the air gap occurs, the air gap is prevented from being excessively expanded during each process in a vacuum state.

DESCRIPTION OF THE REFERENCE NUMERALS IN THE DRAWINGS

10: Semiconductor Package
11: Protrusion Electrode
100: Adhesive Tape for a Semiconductor Package Manufacturing Process
110: First Tape 111: First Base Film
112: First Adhesive Layer
113: First Release Film
120: Second Tape
121: Second Base Film
122: Second Adhesive Layer
123: Second Release Film
130: Third Tape
131: Third Release Film
140: Fourth Tape

BEST MODE

For the difference over the related art, the definiteness of the specification, and the convenience of understanding the technology, constituent elements according to the present disclosure may be illustrated in an exaggerated manner in the accompanying drawings. In addition, terms defined by considering the meanings thereof in the present disclosure will be used below and may vary according to the user's or manager's intention or to practices in the art. Therefore, the definitions of these terms should be defined on the basis of the technical content of the specification as a whole. Constituent elements according to embodiments of the present disclosure are only exemplary examples of the constituent elements recited in the claims, and therefore the embodiments thereof do not impose any limitation on the scope of the present disclosure. The scope of the present disclosure should be interpreted on the basis of the technical idea of the present disclosure in the specification as a whole.

Figure 1:
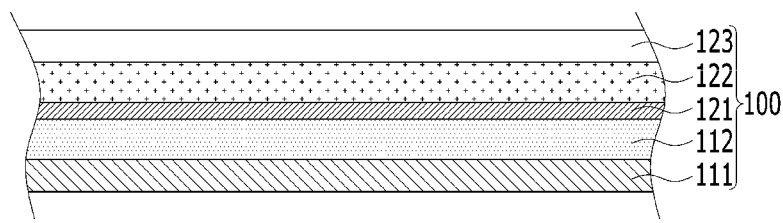
FIG. 1 is a view illustrating a shape of a cross section of an adhesive tape for a semiconductor package manufacturing process according to an embodiment of the present disclosure.
Figure 2:
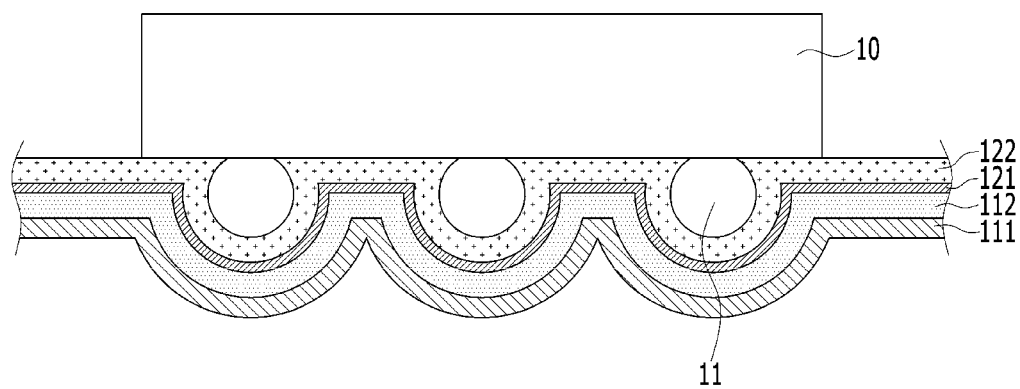
FIG. 2 is a view illustrating the shape of the cross section of the adhesive tape for the semiconductor package illustrated in FIG. 1, the cross section being adhered to a lower surface of a semiconductor package after a second release film is removed from the adhesive tape.
Figure 3:
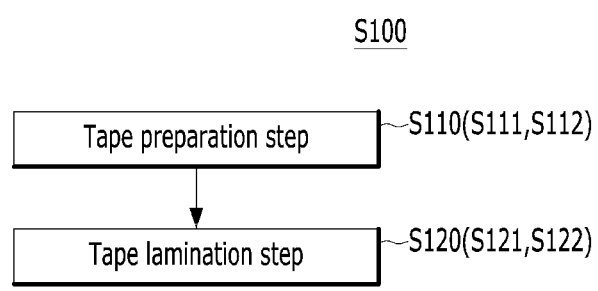
FIG. 3 is a flowchart that is referred to for description of a method of manufacturing the adhesive tape for a semiconductor package manufacturing process according to an embodiment of the present disclosure.
Figure 4:
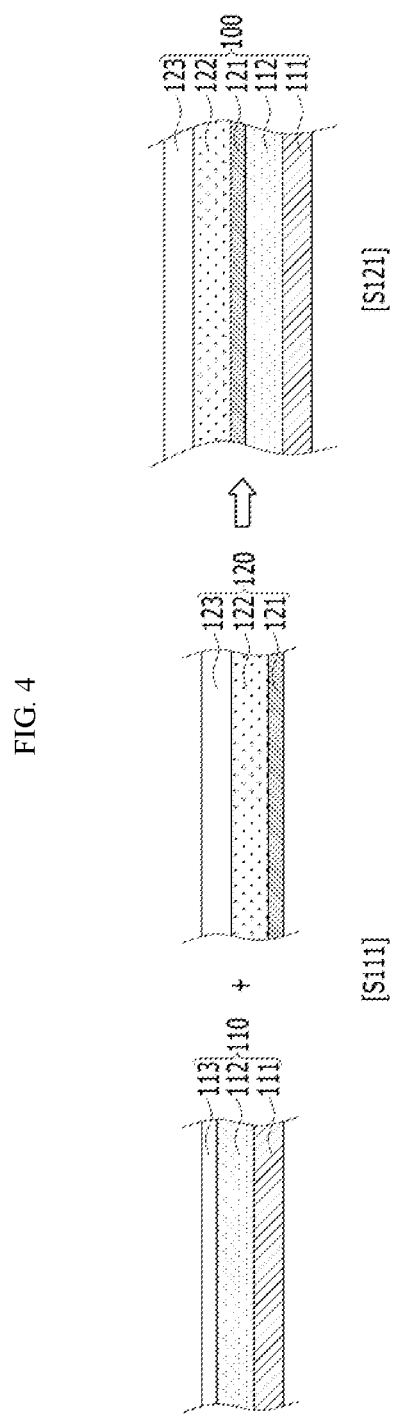
FIG. 4 is a view that is referred to for description of a method of manufacturing the adhesive tape for a semiconductor package manufacturing process according to a first embodiment of the present disclosure.
Figure 5:
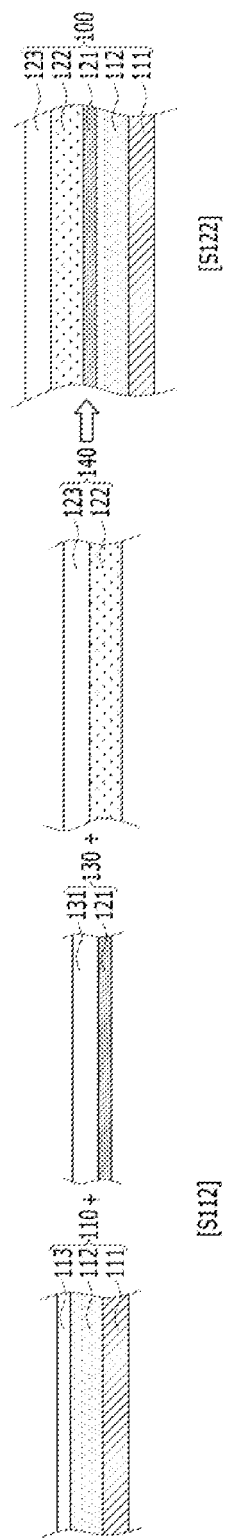
FIG. 5 is a view that is referred to for description of a method of manufacturing the adhesive tape for a semiconductor package manufacturing process according to a second embodiment of the present disclosure.

FIG. 1 is a view illustrating a shape of a cross section of an adhesive tape for a semiconductor package manufacturing process according to an embodiment of the present disclosure. FIG. 2 is a view illustrating the shape of the cross section of the adhesive tape for a semiconductor package illustrated in FIG. 1, the cross section being adhered to a lower surface of a semiconductor package after a second release film is removed from the adhesive tape. FIG. 3 is a flowchart that is referred to for description of a method of manufacturing the adhesive tape for a semiconductor package manufacturing process according to an embodiment of the present disclosure. FIG. 4 is a view that is referred to for description of a method of manufacturing the adhesive tape for a semiconductor package manufacturing process according to a first embodiment of the present disclosure. FIG. 5 is a view that is referred to for description of a method of manufacturing the adhesive tape for a semiconductor package manufacturing process according to a second embodiment of the present disclosure.

Before the embodiments of the present disclosure are described in detail, it should be noted that, normally, the adhesive tape for a semiconductor package manufacturing process that is used during a process of forming an EMI shielding layer needs to ensure an adhesion characteristic, a retention characteristics, a remove characteristic, and a stress characteristic.

First, in terms of the adhesion characteristic, a base film and an adhesive layer of the adhesive tape are required to be possibly adhered to each other and brought into close contact therewith in a manner that corresponds to a protrusion electrode and a topology of the lower surface of the semiconductor package including the protrusion electrode, regardless of a size (for example, a diameter or a height) of the protrusion electrode, in order that an air gap does not occur in a region where the lower surface of the semiconductor package and the protrusion electrode are brought into contact with each other. Furthermore, the adhesive tape is required to be kept well adhered without pushing the protrusion electrode in a process environment for forming the EMI shielding layer, for example, in a high-temperature and high-vacuum environment. That is, the adhesive tape is also required to continuously maintain its ability for adhesion and close contact during the process of forming the EMI shielding layer.

Next, in terms of the retention characteristic, the adhesive tape is required to maintain its original shape without its denaturation, deformation, discoloration, and outgassing under the condition for the process of forming the EMI shielding layer and at the same time to maintain its ability for adhesion and close contact in such a manner as to prevent gas or a particle from penetrating between the adhesive tape and a contact surface of the semiconductor package during each process. Furthermore, in a case where the air gap occurs in the region where the lower surface of the semiconductor package and the protrusion electrode are brought into contact with each other during the process of forming the EMI shielding layer, the adhesive tape is required to prevent the air gap form excessively expanding during each process (particularly, when performing a process in a high-pressure environment).

Next, in terms of the remove characteristic, when removed from the semiconductor package at room temperature or at an atmospheric pressure after undergoing the process of forming the EMI shielding layer, the magnetic tape is required to be easily removed with less force. At the same time, an adhesive material is required not to remain on the lower surface of the semiconductor package and a surface of the protrusion electrode. Particularly, the adhesive tape is required to have such an adhesive force that the semiconductor package (or a chip) can be easily separated using automation equipment that automatically separates the semiconductor package (or the chip) from the adhesive tape. Moreover, the adhesive tape is required not to be perforated or torn by a vacuum chuck or a left pin that is used in the automation equipment. Normally, the automation equipment that automatically separates the semiconductor package (or a semiconductor chip) from the adhesive tape has a maximum tension endurance strength of approximately 500 gf/25 mm. Because of this, in terms of the remove characteristic, it is desirable that the adhesive tape has an adhesive force that is smaller than this maximum tension endurance strength.

Then, in terms of the stress characteristic, because a plurality of semiconductor packages, that is, a plurality of semiconductor chips are seated on and adhered to the adhesive tape during the process of forming the EMI shielding layer, the adhesive tape is required to ensure its suitable-level tensile stress and compressive stress in such a manner that the process of forming the EMI shielding layer is performed in a state where a distance between adjacent semiconductor chips is maintained. That is, the adhesive tape is required to be stably kept taut and at the same time to maintain stress balance in a manner that corresponds to the topology of the lower surface of the semiconductor package including the protrusion electrode.

With reference to FIGS. 1 and 2, an adhesive tape 100 for a semiconductor package manufacturing process according to an embodiment of the present disclosure relates to an adhesive tape 100 for a semiconductor package manufacturing process that is adhered to a lower surface of the semiconductor package 10 on which a plurality of protrusion electrodes 11 are formed.

The adhesive tape 100 for a semiconductor package manufacturing process according to the present disclosure was conceived to ensure the adhesion characteristic, the retention characteristic, the remove characteristic, and the stress characteristic that, as described above, are required during the process of forming the EMI shielding layer.

First, the adhesive tape 100 for a semiconductor package manufacturing process according to the embodiment of the present disclosure is configured to include a first base film 111, a first adhesive layer 112, a second base film 121, and a second adhesive layer 122.

In this case, the adhesive tape 100 for a semiconductor package manufacturing process according to the embodiment of the present disclosure may further include a second release film 123. The second release film 123 will be described in more detail when a method of manufacturing the adhesive tape 100 for a semiconductor package manufacturing process according to an embodiment of the present disclosure is described.

The first base film 111 contains a plastic material or a metal material.

In this case, the first base film 111 of a plastic material may be a single layer that is formed of one of polyethylene terephthalate, polyimide, and polyolefin or may have a multi-layer structure in which two or more layers, formed of two or more, respectively, of polyethylene terephthalate, polyimide, and polyolefin, are stacked on top of each other.

At this point, the first base film 111 may have a thickness of 10 µm to 150 µm. In a case where the first base film 111 has a thickness of less than 10 µm, a user may have difficulty in handling the adhesive tape 100 for a semiconductor package manufacturing process according to the embodiment of the present disclosure. In a case where the first base film 111 has a thickness of more than 150 µm, it may be difficult to maintain the stress balance in a manner that corresponds to the topology of the lower surface of the semiconductor package 10 on which the protrusion electrode 11 is formed.

It is desirable that the first base film 111 of a metal material contains at least 99 wt % or more of aluminum (Al) and has a tensile strength of 4.8 kgf/mm$^2$ to 14.4 kgf/mm$^2$, an elongation of 6.4% to 19.2%, and a thickness of 20 µm to 80 µm or that the first base film 111 of a metal material contains at least 99 wt % or more of copper (Cu) and has a tensile strength of 8 kgf/mm$^2$ to 31.2 kgf/mm$^2$, an elongation of 3.2% to 14.4%, and a thickness of 20 µm to 80 µm.

In this case, the first base film 111 may contain 99 wt % or more of aluminum (Al) or 99 wt % or more of copper (Cu). Moreover, the first base film 111 may contain 1 wt % or less of an additive in order to have the tensile strength and the elongation that are described above. The additive may contain one or more selected from the group consisting of silicon (Si), iron (Fe), manganese (Mn), zinc (Zn), and titanium (Ti).

The reason that the first base film 111 is required to contain 99 wt % or more of aluminum (Al) and to have a tensile strength of 4.8 kgf/mm$^2$ to 14.4 kgf/mm$^2$ is because a phenomenon where the first base film 111 cannot be stably kept taut without being loosened may occur during each process of manufacturing the semiconductor package 10, in a case where the first base film 111 has a tensile strength of less than 4.8 kgf/mm$^2$. Moreover, the reason is because the first base film 111 cannot maintain the stress balance in a manner that corresponds to the topology of the lower surface of the semiconductor package 10 on which the protrusion electrode 11 is formed, in a case where the first base film 111 has a tensile strength of more than 14.4 kgf/mm$^2$.

The reason that the first base film 111 is required to contain 99 wt % or more of aluminum Al and to have an elongation of 6.4% to 19.2% is because it may be difficult to deform the first base film 111 in a manner that corresponds to the topology of the lower surface of the semiconductor package 10, in a case where the first base film 111 has an elongation of less than 6.4%. Moreover, the reason is because it is difficult to continuously keep the first base film 111 deformed during each process, in a case where the first base film 111 has an elongation of more than 19.2%.

The reason that the first base film 111 is required to contain 99 wt % or more of copper (Cu) and to have a tensile strength of 8 kgf/mm$^2$ to 31.2 kgf/mm$^2$ is because the phenomenon where the first base film 111 cannot be stably kept taut without being loosened may occur during each process of manufacturing the semiconductor package 10, in a case where the first base film 111 has a tensile strength of less than 8 kgf/mm$^2$. Moreover, the reason is because the first base film 111 cannot maintain the stress balance in a manner that corresponds to the topology of the lower surface of the semiconductor package 10 on which the protrusion electrode 11 is formed, in a stable manner the first base film 111 has a tensile strength of more than 31.2 kgf/mm$^2$.

The reason that the first base film 111 is required to contain 99 wt % or more of copper (Cu) and to have an elongation of 3.2% to 14.4% is because it may be difficult to deform the first base film 111 in a manner that corresponds to the topology of the lower surface of the semiconductor package 10, in a case where the first base film 111 has an elongation of less than 3.2%. Moreover, the reason is because it is difficult to continuously keep the first base film 111 deformed during each process, in a case where the first base film 111 has an elongation of more than 14.4%.

The first base film 111 of a metal material may have a thickness of 20 µm to 80 µm. In a case where the first base film 111 has a thickness of less than 20 µm, a user may have difficulty in handling the adhesive tape 100 for a semiconductor package manufacturing process according to the embodiment of the present disclosure. In the case where the first base film 111 has a thickness of more than 80 µm, it may be difficult to maintain the stress balance in a manner that corresponds to the topology of the lower surface of the semiconductor package 10 on which the protrusion electrode 11 is formed.

Since the first base film 111 is formed of the material described above in such a manner as to have the structure described above, the stress balance is effectively maintained in a manner that corresponds to the topology of the lower surface of the semiconductor package 10 on which the protrusion electrode 11 is formed, during the process of forming the EMI shielding layer, and the stress characteristic required of the adhesive tape for a semiconductor package manufacturing process is easily ensured. That is, since the first base film 111 is formed of the material described above in such a manner as to have the structure described above, the first base film 111 may be stably kept taut without being loosened, during each process of manufacturing the semiconductor package 10 and, at the same time, may maintain the stress balance in a manner that corresponds to the topology of the lower surface of the semiconductor package 10 on which the protrusion electrode 11 is formed. Moreover, the first base film 111 has the characteristic that denaturation and deformation thereof occur to a less degree in the high-temperature and high-vacuum environment. Furthermore, the first base film 111 contains a plastic material or a metal material. Thus, the first base film 111 prevents an air bubble (gas or a particle), present outside the first base film 111, from being transferred to the first adhesive layer 112.

The first adhesive layer 112 is stacked on top of the first base film 111 and contains an acrylic-based copolymer.

It is desirable that the first adhesive layer 112 has a greater thickness than the second adhesive layer 122 and has a stronger adhesive force than the second adhesive layer 122. More specifically, the first adhesive layer 112 may have a thickness of 100 μm to 700 μm and an adhesive force of at least more than 500 gf/25 mm. That is, the first adhesive layer 112 may have a thickness of 100 μm to 700 μm and an adhesive force of at least more than 500 gf/25 mm, for example, an adhesive force of 500 gf/25 mm to 2500 gf/25 mm in such a manner as to be impregnated with the protrusion electrode 11.

In this case, in a case where the first adhesive layer 112 has a thickness of less than 100 μm, the ability of the first adhesive layer 112 to impregnate with the protrusion electrode 11 the adhesive tape 100 for a semiconductor package manufacturing process and thus to cushion the protrusion electrode 11 during each process can be decreased. In a case where the first adhesive layer 112 has a thickness of less than 700 μm, the ability of the adhesive tape 100 to adhere the lower surface of the semiconductor package 10 and the adhesive tape 100 for a semiconductor package manufacturing process to each other, to bring them into close contact with each other, and to maintain the adhesion the close contact can be decreased.

In a case where the first adhesive layer 112 has an adhesive force of less than 500 gf/25 mm, when the adhesive tape 100 for a semiconductor package manufacturing process is removed from the semiconductor package 10, a defect may occur, such as the occurrence of peeling off from the first adhesive layer 112. In a case where the first adhesive layer 112 has an adhesive force of more than 2500 gf/25 mm, the first adhesive layer 112 has the characteristic that the adhesive force thereof is in proportion to the thickness thereof. Because of this, a difficulty may occur in forming the first adhesive layer 112 in such a manner as to have a thickness thereof required of the adhesive tape 100 for a semiconductor package manufacturing process.

In terms of a material, it is desirable that the first adhesive layer 112 contains at least one of a butyl acrylate-butyl methacrylate-methacrylic acid-methyl methacrylate-styrene copolymer and an acrylic acid-2-ethylhexyl acrylate-2-ethylhexyl methacrylate-glycidyl methacrylate copolymer. In this case, in two types of acrylic-based copolymers, the order in which monomers are combined may be changed. combination methods may include alternating copolymer, block copolymer, random copolymer, isotactic copolymer, syndiotactic copolymer, atactic copolymer, and the like, and the monomers are not limited to a specific combination method.

It is desirable that the first adhesive layer 112 is formed by mixing at least one of a first adhesive composition and a second adhesive composition, and an epoxy-based hardener, applying the resulting mixture to the first base film 111, and then drying and hardening the resulting mixture. The first adhesive composition contains 25 to 30 parts by weight of a butyl acrylate-butyl methacrylate-methacrylic acid-methyl methacrylate-styrene copolymer, and 70 to 75 parts by weight of ethyl acetate, 25 to 30 parts by weight of the second adhesive composition contains acrylic acid-2-ethylhexyl acrylate ethylhexyl methacrylate-glycidyl methacrylate copolymer, 50 to 55 parts by weight of toluene, and 15 to 20 parts by weight of ethyl acetate.

In this case, when butyl acrylate-butyl methacrylate-methacrylic acid-methyl methacrylate-styrene copolymer, which is a main material of the first adhesive composition is less than 25 parts by weight, the adhesive force and heat resistance of the first adhesive layer 112 are decreased, and at the same time, the first adhesive layer 112 becomes too soft. Thus, the first adhesive layer 112 poorly serves as a cushion. Consequently, there occurs a problem in that the second base film 121 is torn. When butyl acrylate-butyl methacrylate-methacrylic acid-methyl methacrylate styrene copolymer is more than 30 parts by weight, the first adhesive layer 112 becomes too hard. Thus, the first adhesive layer 112 poorly serves as a cushion. Consequently, there occurs a problem in that it is difficult to deform the first adhesive layer 112 in a manner that corresponds to the topology of the lower surface of the semiconductor package 10 and that it is also difficult to independently maintain a deformed shape of the first adhesive layer 112 due to expansion after the first adhesive layer 112 is deformed.

In addition, when ethyl acetate that is a solvent of the first adhesive composition of the first adhesive layer 112 is less than 70 parts by weight, the viscosity of the first adhesive composition becomes too high. Thus, it is difficult to mix the second adhesive composition and the epoxy-based hardener. Moreover, a surface of the first adhesive layer 112 is roughened during the applying process and, at the same time, a degassing phenomenon occurs frequently during a drying and hardening process. Consequently, there occurs a problem in that the characteristic of the first adhesive layer 112 deteriorates. In a case where ethyl acetate that is a solvent of the first adhesive composition of the first adhesive layer is more than 75 parts by weight, the viscosity of the first adhesive composition becomes too low. Because of this, it is difficult to form the first adhesive layer 112 in such a manner as that a thickness thereof is sufficient, during the applying process. Thus, there occurs a problem in that a cushioning characteristic of the first adhesive layer 112 deteriorates.

In addition, when acrylic acid-2-ethylhexyl acrylate-2-ethylhexyl methacrylate-glycidyl methacrylate copolymer that is a main adhesive material of the second adhesive composition is less than 25 parts by weight, the adhesive force and the heat resistance of the first adhesive layer 112 are decreased and, at the same time, become too soft. Thus, the first adhesive layer 112 poorly serves as a cushion. Consequently, there occurs a problem in that the second base film 121 is torn. When acrylic acid-2-ethylhexyl acrylate-2-ethylhexyl methacrylate-glycidyl methacrylate copolymer is less than 30 parts by weight, the first adhesive layer 112 becomes too hard and thus poorly serves as a cushion. Consequently, there occurs a problem in that it is difficult to deform the first adhesive layer 112 in a manner that corresponds to the topology of the lower surface of the semiconductor package 10 and that, due to expansion after the first adhesive layer 112 is deformed, it is also difficult to independently keep the first adhesive layer 112 deformed.

In addition, when the sum of toluene and ethyl acetate that are solvents of the second adhesive composition of the first adhesive layer 112 is less than 65 parts by weight, the viscosity of the second adhesive composition becomes too high. Thus, it is difficult to mix the first adhesive composition and the epoxy-based hardener. Moreover, the surface of the first adhesive layer 112 is roughened during the applying process and, at the same time, the degassing phenomenon occurs frequently during the drying and hardening process. Consequently, there occurs a problem in that the characteristic of the first adhesive layer 112 deteriorates. When the sum of toluene and ethyl acetate that are solvents of the second adhesive composition of the first adhesive layer 112 is more than 75 parts by weight, the viscosity of the second adhesive composition becomes too low. Because of this, it is difficult to form the first adhesive layer 112 in such a manner that the thickness thereof is sufficient, during the applying process. Thus, there occurs a problem in that the cushioning characteristic of the first adhesive layer 112 deteriorates.

It is desirable that the first adhesive layer 112 is formed by mixing 80 to 120 parts by weight of the first adhesive composition and 0.5 to 1.5 parts by weight of the epoxy-based hardener, applying the resulting mixture to the first base film 111, and then drying and hardening the first base film 111.

In this case, when the first adhesive composition is less than 80 parts by weight, the adhesive force and the heat resistance of the first adhesive layer 112 are decreased, and at the same time, the first adhesive layer 112 becomes too hard. Thus, the first adhesive layer 112 poorly serves as a cushion. Consequently, there occurs a problem in that it is difficult to deform the first adhesive layer 112 in a manner that corresponds to the topology of the lower surface of the semiconductor package 10. When the first adhesive composition is more than 120 parts by weight, the first adhesive layer 112 becomes too soft and thus poorly serves as a cushion. Consequently, there occurs a problem in that the second base film 121 is torn.

In addition, when the epoxy-based hardener is less than 0.5 parts by weight, the first adhesive layer 112 is not sufficiently hardened and becomes too soft. Thus, the first adhesive layer 112 poorly serves as a cushion. Consequently, there occurs a problem in that the second base film 121 is torn. When the epoxy-based hardener is more than 1.5 parts by weight, the first adhesive layer 112 becomes too hard and thus poorly serves as a cushion. Consequently, there occurs a problem in that it is difficult to deform the first adhesive layer 112 in a manner that corresponds to the topology of the lower surface of the semiconductor package 10.

It is more desirable that the first adhesive layer 112 is formed by mixing 40 to 60 parts by weight of the first adhesive composition, 40 to 60 parts by weight of the second adhesive composition, and 0.5 to 1.5 parts by weight of the epoxy-based hardener, applying the resulting mixture to the first base film 111, and drying and hardening the first base film 111.

In this case, when the first adhesive composition and the second adhesive composition are less than 40 parts by weight, the adhesive force and the heat resistance of the first adhesive layer 112 are decreased, and at the same time, the first adhesive layer 112 becomes too hard. Thus, the first adhesive layer 112 poorly serves as a cushion. Consequently, there occurs a problem in that it is difficult to deform the first adhesive layer 112 in a manner that corresponds to the topology of the lower surface of the semiconductor package 10. When the first adhesive composition is more than 60 parts by weight, the first adhesive layer 112 becomes too soft and thus poorly serves as a cushion. Consequently, there occurs a problem in that the second base film 121 is torn.

In addition, when the epoxy-based hardener is less than 0.5 parts by weight, the first adhesive layer 112 is not sufficiently hardened and becomes too soft. Thus, the first adhesive layer 112 poorly serves as a cushion. Consequently, there occurs a problem in that the second base film 121 is torn. When the epoxy-based hardener is more than 1.5 parts by weight, the first adhesive layer 112 becomes too hard and thus poorly serves as a cushion. Consequently, there occurs a problem in that it is difficult to deform the first adhesive layer 112 in a manner that corresponds to the topology of the lower surface of the semiconductor package 10.

In association with the retention characteristic, the first adhesive layer 112 has an excellent heat resistance at a high temperature due to a material characteristic, thereby reducing the degassing phenomenon and suitably supporting the deformation of the second base film 121. Thus, the second base film 121 is prevented from being torn. Moreover, although the second base film 121 is torn, the first adhesive layer 112 securely surrounds the torn second base film 121, thereby effectively protecting the protrusion electrode 11.

In addition, in associate with the remove characteristic, the first adhesive layer 112 has a stronger adhesive force than the second adhesive layer 122. Therefore, after the process of forming the EMI shielding layer is finished, the first adhesive layer 112 is separated from the second adhesive layer 122 when the adhesive tape 100 for a semiconductor package manufacturing process is separated from the semiconductor package 10.

The first adhesive layer 112 has a thickness of 100 μm to 700 μm. However, it is desirable that the more increased a size of the protrusion electrode 11, the more decreased the thickness of the first adhesive layer 112 is in a preset thickness range and that the more increased a gap between the protrusion electrodes 11, the more increased the thickness of the first adhesive layer 112 is in the preset thickness range.

The reason that the more increased the size of the protrusion electrode 11, the more decreased the thickness of the first adhesive layer 112 is in the preset thickness range is because the thickness of the second adhesive layer 122 is increased in the same environment. Therefore, there is a need to uniformly maintain the entire thickness of the adhesive tape 100 for a semiconductor package manufacturing process and to uniformly maintain the adhesion characteristic, the remove characteristic, the retention characteristic, and the stress characteristic of the adhesive tape 100 for a semiconductor package manufacturing process that are required in a process of manufacturing the semiconductor package 10.

The reason that the more increased the gap between the protrusion electrodes 11, the more increased the thickness of the first adhesive layer 112 is in the preset thickness range is because the thickness of the second adhesive layer 122 is decreased in the same environment. Therefore, there is a need to uniformly maintain the entire thickness of the adhesive tape 100 for a semiconductor package manufacturing process and to uniformly maintain the adhesion characteristic, the remove characteristic, the retention characteristic, and the stress characteristic of the adhesive tape 100 for a semiconductor package manufacturing process that are required in the process of manufacturing the semiconductor package 10. Particularly, in a case where the gap between the protrusion electrodes 11 is increased, an area of the lower surface of the semiconductor package 10 that is brought into contact with the second adhesive layer 122 is increased. Thus, after a process of forming the EMI shielding layer is performed, the adhesive tape 100 for a semiconductor package manufacturing process is not easily removed, or there is a high likelihood that a problem will occur in that an adhesive material remains on the lower surface of the semiconductor package 10. Therefore, the adhesive force for adhesion to the lower surface of the semiconductor package 10 is decreased by decreasing the thickness of the second adhesive layer 122.

The second base film 121 is stacked on top of the first adhesive layer 112. The second base film 121 contains a metal material in such a manner as to be deformed in a manner that corresponds to the topology of the lower surface of the semiconductor package 10 and then to keep the second base film 121 deformed during each process.

As a practical example of the present disclosure, it is preferable that the second base film 121 has a thickness of 1 μm to 10 μm. The reason for this is as follows. In a case where the second base film 121 has a thickness of less than 1 μm, the user has great difficulty not only in handling the adhesive tape 100 for a semiconductor package manufacturing process, but also in keeping the second base film 121 deformed. In a case where the second base film 121 has a thickness of more than 10 μm, it is difficult to deform the second base film 121 in a manner that corresponds to the topology of the lower surface of the semiconductor package 10 on which the protrusion electrode 11 is formed and to maintain the stress balance. Unlike in another practical example of the present disclosure that will be described below, the thickness in this range is advantageous in a case where the protrusion electrode 11 has a great size.

For example, the second base film 121 may be manufactured in the shape of a transfer film resulting from metal deposition, by depositing aluminum (Al) or copper (Cu) on the release film, and then may be laminated on the first adhesive layer 112. This manufacturing and laminating of the second base film 121 will be described in detail below when describing a method S100 of manufacturing the adhesive tape 100 for a semiconductor package manufacturing process according to a second embodiment of the present disclosure.

It is desirable that the second base film 121 contains at least 99 wt % or more of aluminum (Al) and has a tensile strength of 4.8 kgf/mm$^2$ to 14.4 kgf/mm$^2$, an elongation of 6.4% to 19.2%, and a thickness of 10 μm to 35 μm. Alternatively, it is desirable that the second base film 121 contains at least 99 wt % or more of copper (Cu), a tensile strength of 8 kgf/mm$^2$ to 31.2 kgf/mm$^2$, an elongation of 3.2% to 14.4%, and a thickness of 10 μm to 35 μm.

More specifically, during a process of manufacturing the semiconductor package 10, the second base film 121 may be deformed in a manner that corresponds to the topology of the lower surface of the semiconductor package 10 on which the protrusion electrode 11 is formed, and then may be independently kept deformed. The second base film 121 may contain 99 wt % or more of aluminum (Al) or 99 wt % or more of copper (Cu) in such a manner that denaturation and deformation thereof do not occur in the high-temperature and high-pressure environment.

In this case, the second base film 121 may contain 99 wt % or more of aluminum (Al) or 99 wt % or more of copper (Cu). Moreover, the second base film 121 may contain 1 wt % or less of an additive in order to have the tensile strength and the elongation that are described above. The additive may contain one or more selected from the group consisting of silicon (Si), iron (Fe), manganese (Mn), zinc (Zn), and titanium (Ti).

The reason that the second base film 121 is required to have a 99 wt % or more of aluminum (Al) and have a tensile strength of 4.8 kgf/mm$^2$ to 14.4 kgf/mm$^2$ is because there may occur a phenomenon where the second base film 121 is cut or torn due to an external force that is applied during a process of manufacturing the adhesive tape 100 for a semiconductor package manufacturing process and during the process of forming the EMI shielding layer, in a case where the second base film 121 has a tensile strength of less than 4.8 kgf/mm$^2$. Moreover, the reason is because it is difficult to deform the second base film 121 in a manner that corresponds to the topology of the lower surface of the semiconductor package 10, in a case where the second base film 121 has a tensile strength of less than more than 14.4 kgf/mm$^2$.

The reason that the second base film 121 is required to contain 99 wt % or more of aluminum Al and to have an elongation of 6.4% to 19.2% is because it may be difficult to deform the second base film 121 in a manner that corresponds to the topology of the lower surface of the semiconductor package 10, in a case where the second base film 121 has an elongation of less than 6.4%. Moreover, the reason is because it is difficult to continuously keep the second base film 121 deformed during each process, in a case where the second base film 121 has an elongation of more than 19.2%.

The reason that the second base film 121 is required to contain 99 wt % or more of copper (Cu) and to have a tensile strength of 8 kgf/mm$^2$ to 31.2 kgf/mm$^2$ is because there may occur the phenomenon where the second base film 121 is cut or torn due to the external force that is applied during the process of manufacturing the adhesive tape 100 for a semiconductor package manufacturing process and during the process of forming the EMI shielding layer, in a case where the second base film 121 has a tensile strength of less than 8 kgf/mm$^2$. Moreover, the reason is because it is difficult to deform the second base film 121 in a manner that corresponds to the topology of the lower surface of the semiconductor package 10, in a case where the second base film 121 has a tensile strength of 31.2 kgf/mm$^2$.

The reason that the second base film 121 is required to contain 99 wt % or more of copper (Cu) and to have an elongation of 3.2% to 14.4% is because it may be difficult to deform the second base film 121 in a manner that corresponds to the topology of the lower surface of the semiconductor package 10, in a case where the second base film 121 has an elongation of less than 3.2%. Moreover, the reason is because it is difficult to continuously keep the second base film 121 deformed during each process, in a case where the second base film 121 has an elongation of more than 14.4%.

As another practical example of the present disclosure, the second base film 121 may have a thickness of 10 μm to 35 μm. The reason for this is as follows. In a case where the second base film 121 has a thickness of less than 10 μm, it is very difficult to handle the adhesive tape 100 for a semiconductor package manufacturing process. In a case where the second base film 121 has a thickness of more than 35 μm, it is difficult to deform the second base film 121 in a manner that corresponds to the topology of the lower surface of the semiconductor package 10 on which the protrusion electrode 11 is formed and to maintain the stress balance. Unlike in the practical example of the present disclosure, the thickness in this range is advantageous in a case where the protrusion electrode 11 has a small size.

Since the second base film 121 contains a metal material, the second base film 121 may prevent an air bubble (gas or a particle), which may occur in the first adhesive layer 112, from being transferred to the second adhesive layer 122. Moreover, when the adhesive tape 100 for a semiconductor package manufacturing process is attached on the lower surface of the semiconductor package 10, due to the sufficient retention characteristic, the second base film 121, after deformed in a manner that corresponds to the topology of the lower surface of the semiconductor package 10, may be kept deformed during each process. That is, since the second base film 121 contains a metal material, the second base film 121 blocks gas or the like which occurs in the first adhesive layer 112, from being transferred to the second adhesive layer 122. Moreover, the second base film 121 supports the second adhesive layer 122 in such a manner as to be kept flat. Thus, in the high-temperature and high-vacuum environment, the second base film 121 continuously maintains its ability for adhesion to and close contact with the lower surface of the semiconductor package 10 that includes the protrusion electrode 11.

The second adhesive layer 122 is stacked on top of the second base film 121 and contains silicon having a spiral network structure.

It is desirable that the second adhesive layer 122 has a small diameter than the first adhesive layer 112 and has a weaker adhesive force than the first adhesive layer 112. More specifically, the second adhesive layer 122 may have a thickness of 10 μm to 50 μm and an adhesive force of 50 gf/25 mm to 500 gf/25 mm in such a manner as to be possibly adhered perfectly along the topology of the lower surface of the semiconductor package 10 on which the protrusion electrode 11 is formed.

At this point, in a case where the second adhesive layer 122 has a thickness of less than 10 μm, the second adhesive layer 122 cannot secure an adhesive force necessary. Because of this, during a process, the ability for adhesion to and close contact with the lower surface of the semiconductor package 10 and the retention characteristic deteriorate, and thus a peeling-off phenomenon may occur. In a case where the second adhesive layer 122 has a thickness of more than 50 μm, the second adhesive layer 122, when attached on the lower surface of the semiconductor package 10, is pushed, with pressing pressure, to a lateral side. Thus, there may occur a problem in that a defect occurs or that removal from the semiconductor package 10 is difficult.

In a case where the second adhesive layer 122 has an adhesive force of less than 50 gf/25 mm, the second adhesive layer 122 is pushed from the lower surface of the semiconductor package 10 and the protrusion electrode 11 in the high-temperature and high-vacuum environment during the process of forming the EMI shielding layer. Thus, the peeling-off phenomenon may occur, or a phenomenon where gas and a particle penetrate between the second adhesive layer 122 and an adhesion surface of the semiconductor package 10 may occur during each process. In a case where the second adhesive layer 122 has an adhesive force of more than 500 gf/25 mm, removal from the semiconductor package 10 may be difficult at room temperature or at an atmospheric pressure after undergoing the process of forming the EMI shielding layer, or there may occur a problem in that the adhesive material remains on the lower surface of the semiconductor package and the surface of the protrusion electrode 11.

In terms of a material, it is desirable that the second adhesive layer 122 contains a trimethylated silica-dimethyl siloxane copolymer.

Since the second adhesive layer 122 contains the trimethylated silica-dimethyl siloxane copolymer, physical deformation due to heat occurring during the process of forming the EMI shielding layer is reduced, and the adhesion characteristic, the retention characteristic, the remove characteristic, and the stress characteristic that are required of the adhesive tape for a semiconductor package manufacturing process are easily ensured.

Furthermore, the second adhesive layer 122 has the spiral network structure as a molecular structure, with a siloxane bond as a basic frame. Therefore, although an air gap occurs between each of the lower surface of the semiconductor package 10, the protrusion electrode 11, and the second adhesive layer 122, even in the high-temperate and high-vacuum environment, the air gap is prevented from being excessively expanded.

The second adhesive layer 122 has a thickness of 10 μm to 50 μm. However, it is desirable that the more increased the size of the protrusion electrode 11, the more increased the thickness of the second adhesive layer 122 is in a preset thickness range and that the more increased the gap between the protrusion electrodes 11, the more decreased the thickness of the second adhesive layer 122 is in the preset thickness range.

The reason that the more increased the size of the protrusion electrode 11, the more increased the thickness of the second adhesive layer 122 is in the preset thickness range is because the more increased the size of the protrusion electrode 11, the higher a likelihood that the second adhesive layer 122 will be pushed from the protrusion electrode 11 and be reeled off. Thus, there is a need to increase the adhesive force of the second adhesive layer 122.

In addition, the reason that the more increased the gap between the protrusion electrodes 11, the more decreased the thickness of the second adhesive layer 122 is in the preset thickness range is because the more increased the gap between the protrusion electrodes 11, the more increased the area of the lower surface of the semiconductor package 10 that is adhered to the second adhesive layer 122. The increase in the area of the lower surface of the semiconductor package 10 may cause the problem that the second adhesive layer 122 is not easily removed after the process of forming the EMI shielding layer or that the adhesive material remains on the lower surface of the semiconductor package 10. Therefore, there is a need to decrease the adhesive force of the second adhesive layer 122.

In association with the adhesion characteristic, the second adhesive layer 122 contains silicon having a spiral network structure. Thus, respective regions of the lower surface of the semiconductor package 10 and the protrusion electrode 11 that are brought into contact with each other have the sufficient adhesion characteristic. In association with the remove characteristic, the second adhesive layer 122 contains a weaker adhesive force than the first adhesive layer 112. Thus, when the adhesive tape 100 for a semiconductor package manufacturing process is removed from the semiconductor package 10 after the process of forming the EMI shielding layer, the second adhesive layer 122 is separated instead of the first adhesive layer 112.

As described above, the adhesive tape 100 for a semiconductor package manufacturing process according to the present disclosure has excellent adhesion, retention, remove, and stress characteristics. The lower surface of the semiconductor package 10 and a plurality of the protrusion electrodes 11 formed on the lower surface of the semiconductor package 10 are effectively protected during the process of forming the EMI shielding layer for the semiconductor package 10 including the plurality of the protrusion electrodes 11.

The method S100 of manufacturing the adhesive tape 100 for a semiconductor package manufacturing process according to the embodiment of the present disclosure will be described below with reference to FIGS. 3 to 5.

The first embodiment and the second embodiment will be described separately. The above-described configuration of the adhesive tape 100 for a semiconductor package manufacturing process may be partially omitted when determined as being repeated.

The method S110 of manufacturing the adhesive tape 100 for a semiconductor package manufacturing process according to the embodiment of the present disclosure is configured to include a tape preparation step S110 and a tape lamination step S120.

First Embodiment

The method S100 of manufacturing the adhesive tape 100 for a semiconductor package manufacturing process is configured to include a first tape preparation step S111 and a first tape lamination step S121.

The first tape preparation step S111 is a step in which a first tape 110 and a second tape 120 are manufactured. The first tape 110 is manufactured by sequentially stacking the first base film 111 containing a plastic material or a metal material, the first adhesive layer 112 containing an acrylic-based copolymer, and a first release film 113 containing fluorine on top of each other. The second tape 120 is manufactured by sequentially stacking a second base film 121 containing a metal material, the second adhesive layer 122 containing silicon having a spiral network structure, and a second release film 123.

First, a step of manufacturing the first tape 110 starts with a manufacturer's preparing the first base film 111 containing a plastic material or a metal material. As described above, the first base film 111 may contain at least 99 wt % or more of aluminum (Al) and may have a tensile strength of 4.8 kgf/mm$^2$ to 14.4 kgf/mm$^2$, an elongation of 6.4% to 19.2%, and a thickness of 20 μm to 80 μm. Alternatively, the first base film 111 may contain at least 99 wt % or more of copper (Cu) and may have a tensile strength of 8 kgf/mm$^2$ to 31.2 kgf/mm$^2$, an elongation of 3.2% to 14.4%, and a thickness of 20 μm to 80 μm. In addition, the first base film 111 may be a single layer that is formed of one of polyethylene terephthalate, polyimide, and polyolefin or may have a multi-layer structure in which two or more layers, formed of two or more, respectively, of polyethylene terephthalate, polyimide, and polyolefin, are stacked on top of each other. The first base film 111 may have a thickness of 10 μm to 150 μm.

Subsequently, the manufacturer puts into a mixture container the first adhesion composition (80 to 120 parts by weight) containing 25 to 30 parts by weight of a butyl acrylate-butyl methacrylate-methacrylic acid-methyl methacrylate-styrene copolymer and 70 to 75 parts by weight of ethyl acetate, and the epoxy-based hardener (0.5 to 1.5 parts by weight) and mixes them by stirring. Alternatively, the manufacturer puts into the mixture container the first adhesion composition (40 to 60 parts by weight) containing 25 to 30 parts by weight of a butyl acrylate-butyl methacrylate-methacrylic acid-methyl methacrylate-styrene copolymer and 70 to 75 parts by weight of ethyl acetate, the second adhesion composition (40 to 60 parts by weight) containing 25 to 30 parts by weight of an acrylic acid-2-ethylhexyl acrylate-2-ethylhexyl methacrylate-glycidyl methacrylate copolymer, 50 to 55 parts by weight of toluene, and 15 to 20 parts by weight of ethyl acetate, and the epoxy-based hardener and mixes them by stirring. At this point, the mixing is performed by stirring at room temperature and at normal moisture.

At this point, the manufacturer stabilizes an acrylic-based composition that results from mixing, by stirring, the first adhesive composition and the epoxy-based hardener, or an acrylic-based composition that results from mixing, by stirring, the first adhesive composition, the second adhesive composition, and the epoxy-based hardener. The acrylic-based composition is stabilized in order to remove an air bubble within the acrylic-based composition and at the same time to induce chemical stability of the acrylic-based composition and a uniform cross-linking reaction. As one way of stabilizing the acrylic-based composition, ultrasonic treatment or vacuum suction is possibly performed in order to remove the air bubble within the acrylic-based composition. The manufactured acrylic-based composition may be brought to rest in a thermal equilibrium state for stabilization of the acrylic-based composition for 4 hours to 12 hours after the air bubble is removed. In order to ensure the chemical stability and to prevent an abrupt cross-linking reaction, it is desirable that the acrylic-based composition is stabilized in the thermal equilibrium state.

Subsequently, the manufacturer forms the first adhesive layer 112 by applying the stabilized acrylic-based composition on top of the first base film 111 using a comma coater, a slot-die coater, a gravure coater, and the like and then drying and hardening the resulting acrylic-based composition.

At this time, the manufacturer may apply the acrylic-based composition on top of the first base film 111 to a thickness greater than a final thickness of the first adhesive layer 112, using the comma coater, the slot-die coater, the gravure coater, and the like. Specifically, the comma coater, the slot-die coater, the gravure coater, and the like may be controlled to apply the acrylic-based composition to a thickness 2.5 times to 3.5 times a target thickness of the first adhesive layer 112. For example, in a case where the first adhesive layer 112 has a target thickness of 100 μm to 700 μm, the comma coater may be controlled in such a manner that the acrylic-based composition is applied to a thickness of 250 μm to 2450 μm. A step of applying the stabilized acrylic-based composition on top of the first base film 111 may be performed with a spin coating technique, a spray technique, or the like.

Subsequently, the manufacturer may finally form the first adhesive layer 112 through drying and heat-treatment and through aging and hardening. During these processes, the thickness of the first adhesive layer 112 is gradually decreased and reaches a target thickness.

More specifically, the manufacturer performs the drying and heat treatment on the first adhesive layer 112. The drying and heat treatment is performed to remove a solvent within the acrylic-based composition and at the same time to activate the cross-linking reaction. The drying and heat treatment is performed at a temperature range from 90° C. to 120° C. for 15 minutes to 30 minutes, using an infrared lamp, a dryer that uses both infrared light and hot air, and the like.

Depending on the situation, the drying and heat treatment may include first drying and heat treatment, second drying and heat treatment, and third drying and heat treatment that are separately performed.

In this case, the first drying and heat treatment may be performed to remove the solvent within the acrylic-based composition and at the same time to activate the cross-linking reaction. The first drying and heat treatment may be performed at a temperature of 60° C. to 80° C. for 3 minutes to 6 minutes, using the infrared lamp, the dryer that uses both infrared light and hot air, and the like.

Subsequently, like the first drying and heat treatment, the second drying and heat treatment may be performed to remove the solvent within the acrylic-based composition and at the same time to activate the cross-linking reaction. The second drying and heat treatment may be performed at a higher temperature than the first drying and heat treatment, for the same time as the first drying and heat treatment, using the infrared lamp, the dryer that uses both infrared light and hot air, and the like. For example, the second drying and heat treatment may be performed at a temperature of 90° C. to 120° C. for 3 minutes to 6 minutes.

Subsequently, like the first drying and heat treatment and the second drying and heat treatment, the third drying and heat treatment may be performed to remove the solvent within the acrylic-based composition and at the same time to activate the cross-linking reaction. The third drying and heat treatment may be performed at a higher temperature than the second drying and heat treatment, for a longer time than the second drying and heat treatment, using the infrared lamp, the dryer that uses both infrared light and hot air, and the like. For example, the third drying and heat treatment may be performed at a temperature of 190° C. to 210° C. for 9 minutes to 18 minutes.

At this point, the reason that in the first drying and heat treatment, the second drying and heat treatment, and the third drying and heat treatment, the first adhesive layer 112 is dried while the temperature is gradually increased is to prevent the first adhesive layer 112 from being dried and hardened, starting from a surface thereof. Accordingly, the air bubble within the first adhesive layer 112 may be easily removed. Furthermore, after the third drying and heat treatment is performed, the temperature is gradually decreased to room temperature. Thus, the first adhesive layer 112 in a stable state that has a uniform thickness may be formed.

Subsequently, the manufacturer ages the first adhesive layer 112 at a temperature of 20° C. to 60° C. for 12 hours to 48 hours for stabilization and hardening. That is, for a resting period, the first base film 111 and the first adhesive layer 112 that are heated during the drying and heat treatment are gradually cooled to a temperature of 20° C. to 60° C. Thus, the cross-linking reaction within the first adhesive layer 112 is stably finished, and, at the same time, a physical property required of the first adhesive layer 112 is secured.

Subsequently, the manufacturer attaches the first release film 113, containing fluorine, on the first adhesive layer 112. The first release film 113 may contain fluorine in such a manner as to protect the first adhesive layer 112 containing the acrylic-based copolymer and, at the same time, to be easily separated from the first adhesive layer 112. The first release film 113 may have an adhesive force of 3 gf/25 mm to 8 gf/25 mm. At this point, in a case where the first release film 113 has an adhesive force of less than 3 gf/25 mm, the first release film 113 may be naturally reeled off from the first adhesive layer 112. In a case where the first release film 113 has an adhesive force of more than 8 gf/25 mm, there occurs a problem in that the first adhesive layer 112 may be damaged while the first release film 113 is removed.

The manufacturer may manufacture the first tape 110 by performing the above-described processes.

A step of manufacturing the second tape 120 is described. First, the manufacturer prepares the second base film 121 that contains at least 99 wt % or more of aluminum (Al) and has a tensile strength of 4.8 kgf/mm$^2$ to 14.4 kgf/mm$^2$, an elongation of 6.4% to 19.2%, and a thickness of 10 μm to 35 μm, or prepares at least 99 wt % or more of copper (Cu) and has a tensile strength of 8 kgf/mm$^2$ to 31.2 kgf/mm$^2$, an elongation of 3.2% to 14.4%, and a thickness of 10 μm to 35 μm.

Subsequently, the manufacturer puts into the mixture container a trimethylated silica-dimethyl siloxane copolymer, an ethylbenzene solvent, and an epoxy-based hardener and mixes them by stirring. At this point, the mixing is performed by stirring at room temperature and at normal moisture.

At this point, the manufacturer stabilizes a silicon-based composition that results from the mixing. The silicon-based composition is stabilized in order to remove an air bubble within the silicon-based composition and at the same time to induce chemical stability of the silicon-based composition and a uniform cross-linking reaction. As one way of stabilizing the silicon-based composition, ultrasonic treatment or vacuum suction is possibly performed in order to remove the air bubble within the silicon-based composition. The manufactured silicon-based composition may be brought to rest in a thermal equilibrium state for stabilization of the silicon-based composition for 4 hours to 12 hours after the air bubble is removed. In order to ensure the chemical stability and to prevent an abrupt cross-linking reaction, it is desirable that the silicon-based composition is stabilized in the thermal equilibrium state.

Subsequently, the manufacturer forms the second adhesive layer 122 by applying the stabilized silicon-based composition on top of the second base film 121 using the comma coater, the slot-die coater, the gravure coater, and the like and then drying and hardening the resulting silicon-based composition.

At this time, the manufacturer may apply the silicon-based composition on top of the second base film 121 to a thickness greater than a final thickness of the second adhesive layer 122, using the comma coater, the slot-die coater, the gravure coater, and the like. Specifically, the comma coater, the slot-die coater, the gravure coater, and the like may be controlled to apply the silicon-based composition to a thickness 2.5 times to 3.5 times a target thickness of the second adhesive layer 122. For example, in a case where the second adhesive layer 122 has a target thickness of 10 μm to 50 μm, the comma coater may be controlled in such a manner that the silicon-based composition is applied to a thickness of 25 μm to 175 μm. A step of applying the stabilized silicon-based composition on top of the second base film 121 may be performed with the spin coating technique, the spray technique, or the like.

Subsequently, the manufacturer may finally form the second adhesive layer 122 through drying and heat-treatment and through aging and hardening. During these processes, the thickness of the second adhesive layer 122 is gradually decreased and reaches a target thickness.

More specifically, the manufacturer performs the drying and heat treatment on the second adhesive layer 122. The drying and heat treatment is performed to remove a solvent within the silicon-based composition and at the same time to activate the cross-linking reaction. The drying and heat treatment is performed at a temperature range from 160° C. to 180° C. for 15 minutes to 30 minutes, using the infrared lamp, the dryer that uses both infrared light and hot air, and the like.

Depending on the situation, the drying and heat treatment may include the first drying and heat treatment, the second drying and heat treatment, and the third drying and heat treatment that are separately performed.

In this case, the first drying and heat treatment may be performed to remove the solvent within the silicon-based composition and at the same time to activate the cross-linking reaction. The first drying and heat treatment may be performed at a temperature range from 60° C. to 80° C. for 3 minutes to 6 minutes, using the infrared lamp, the dryer that uses both infrared light and hot air, and the like.

Subsequently, like the first drying and heat treatment, the second drying and heat treatment may be performed to remove the solvent within the silicon-based composition and at the same time to activate the cross-linking reaction. The second drying and heat treatment may be performed at a higher temperature than the first drying and heat treatment, for the same time as the first drying and heat treatment, using the infrared lamp, the dryer that uses both infrared light and hot air, and the like. For example, the second drying and heat treatment may be performed at a temperature of 160° C. to 180° C. for 3 minutes to 6 minutes.

Subsequently, like the first drying and heat treatment and the second drying and heat treatment, the third drying and heat treatment may be performed to remove the solvent within the silicon-based composition and at the same time to activate the cross-linking reaction. The third drying and heat treatment may be performed at a higher temperature than the second drying and heat treatment, for a longer time than the second drying and heat treatment, using the infrared lamp, the dryer that uses both infrared light and hot air, and the like. For example, the third drying and heat treatment may be performed at a temperature of 190° C. to 210° C. for 9 minutes to 18 minutes.

At this point, the reason that in the first drying and heat treatment, the second drying and heat treatment, and the third drying and heat treatment, the second adhesive layer 122 is dried while the temperature is gradually increased is to prevent the second adhesive layer 122 from being dried and hardened, starting from a surface thereof. Accordingly, the air bubble within the second adhesive layer 122 may be easily removed. Furthermore, after the third drying and heat treatment is performed, the temperature is gradually decreased to room temperature. Thus, the second adhesive layer 122 in a stable state that has a uniform thickness may be formed.

Subsequently, the manufacturer ages the second adhesive layer 122 at a temperature of 20° C. to 30° C. for 12 hours to 24 hours for stabilization and hardening. That is, for the resting period, the second base film 121 and the second adhesive layer 122 that are heated during the drying and heat treatment are gradually cooled to a temperature of 20° C. to 30° C. Thus, the cross-linking reaction within the second adhesive layer 122 is stably finished, and, at the same time, a physical property required of the second adhesive layer 122 is secured.

Subsequently, the manufacturer attaches the second release film 123, containing fluorine, on the second adhesive layer 122. The second release film 123 may contain fluorine in such a manner as to protect the second adhesive layer 122 containing silicon having the spiral network structure and, at the same time, to be easily separated from the second adhesive layer 122. The second release film 123 may have an adhesive force of 3 gf/25 mm to 8 gf/25 mm. At this point, in a case where the second release film 123 has an adhesive force of less than 3 gf/25 mm, the second release film 123 may be naturally reeled off from the second adhesive layer 122. In a case where the second release film 123 has an adhesive force of more than 8 gf/25 mm, there occurs a problem in that the second adhesive layer 122 may be damaged while the second release film 123 is removed.

The manufacturer may manufacture the second tape 120 by performing the above-described processes.

The first tape lamination step S121 is a step in which the manufacturer removes the first release film 113 from the first tape 110, brings the first adhesive layer 112 and the second base film 121 into surface contact with each other, and thus laminates the first tape 110 and the second tape 120 to each other.

Thereafter, before the process of forming the EMI shielding layer, the user attaches the adhesive tape 100 for a semiconductor manufacturing process according to the embodiment of the present disclosure by removing the second release film 123 of the second tape 120 and bringing the second adhesive layer 122 into contact with the lower surface of the semiconductor package 10 and with the protrusion electrode 11.

Second Embodiment

The method S100 of manufacturing the adhesive tape 100 for a semiconductor package manufacturing process according to the second embodiment of the present disclosure is configured to include a second tape preparation step S112 and a second tape lamination step S122.

The second tape preparation step S112 is a step in which a first tape 110, a third tape 130, and a fourth tape 140 are manufactured. The first tape 110 is manufactured by sequentially stacking the first base film 111 containing a plastic material or a metal material, the first adhesive layer 112 containing an acrylic-based copolymer, and a first release film 113 containing fluorine on top of each other. The third tape 130 is manufactured by depositing the second base film 121 on a third release film 131 using a metal deposition technique. The fourth tape 140 is manufactured by sequentially stacking the second adhesive layer 122 containing silicon having a spiral network structure and the second release film 123 containing fluorine on top of each other.

A step of manufacturing the first tape 110 is the same as in the first embodiment, and therefore, a detailed description thereof is omitted.

A step of manufacturing the third tape 130 is performed by forming the second base film 121 on the third release film 131 using the metal deposition technique. More specifically, the second base film 121 is formed by depositing Al or Cu on the third release film 131 using the metal deposition technique, and as a result, the third tape 130 may be manufactured in the shape of a transfer film resulting from metal deposition. A sputtering technique or the like may be used as the metal deposition technique. However, the metal deposition technique is not limited thereto.

The third release film 131 may have the same characteristic as the first release film 113 and the second release film 123.

In this case, it is desirable that the second base film 121 is deposited on the third release film 131 in such a manner as to have a thickness of 1 μm to 10 μm. The thickness in this range is advantageous in a case where the protrusion electrode 11 has a large size.

A step of manufacturing the fourth tape 140 is performed by forming the second adhesive layer 122 by utilizing the second release film 123 as a base film. The second adhesive layer 122 in the second embodiment is formed in the same manner as the second adhesive layer 122 is formed on the second base film 121 in the first embodiment, and therefore, a detailed description thereof is omitted.

In the second tape lamination step S122, the manufacturer removes the first release film 113 from the first tape 110, then brings the first adhesive layer 112 and the second base film 121 of the third tape 130 into surface contact with each other, and laminates the first tape 110 and the third tape 130 on each other. Subsequently, the manufacturer removes the third release film 131 from the third tape 130, then brings the second base film 121 and the second adhesive layer 122 of the fourth tape 140 into surface contact with each other, and laminates the third tape 130 and the fourth tape 140 on each other.

Thereafter, before the process of forming the EMI shielding layer, the user attaches the adhesive tape 100 for a semiconductor manufacturing process according to the embodiment of the present disclosure by removing the second release film 123 of the fourth tape 140 and bringing the second adhesive layer 122 into contact with the lower surface of the semiconductor package 10 and with the protrusion electrode 11.

As described above, with the method S100 of manufacturing the adhesive tape 100 for a semiconductor package manufacturing process according to the embodiment of the present disclosure, the first to fourth tapes 110 to 140 are manufactured through an individual manufacturing process, then are laminated on each other, and thus the adhesive tape 100 for a semiconductor manufacturing process are manufactured as a final product. In a case where a defect occurs in the tape during the processes of manufacturing the first to fourth tapes 110 to 140, it is possible to individually discard only the defective tape. Thus, the overall process yield is improved.

The embodiments of the present disclosure are described above only in an exemplary manner with reference to the drawings. It would be understandable to a person of ordinary skill in the art to which the present disclosure pertains that various modifications and equivalents are possibly made to the embodiments. Accordingly, the proper technical scope of the present disclosure should be defined in the following claims in light of the detailed description of the present disclosure.

INDUSTRIAL APPLICABILITY

The present disclosure relates to an adhesive tape for a semiconductor package manufacturing process and possibly finds application in the industrial field associated with a process of forming an Electromagnetic Interference (EMI) shielding layer for a semiconductor package.

The invention claimed is:

1. An adhesive tape for a semiconductor package manufacturing process, the adhesive tape being attached on a lower surface of a semiconductor package on which a plurality of protrusion electrodes are formed, the adhesive tape comprising:
a first base film;
a first adhesive layer containing an acrylic-based copolymer, the first adhesive layer being stacked on top of the first base film;
a second base film containing a metal material in such a manner as to be deformed and then kept deformed during each process in a manner that corresponds to a topology of the lower surface of the semiconductor package, the second base film being stacked on top of the first adhesive layer; and
a second adhesive layer containing silicon having a spiral network structure, the second adhesive layer being on top of the second base film,
wherein the second adhesive layer contains a trimethylated silica-dimethyl siloxane copolymer.

2. The adhesive tape of claim 1, wherein the first base film contains a plastic material or a metal material.

3. The adhesive tape of claim 2, wherein the first base film is a single layer that is formed of one of polyethylene terephthalate, polyimide, and polyolefin or has a multi-layer structure in which two or more layers, formed of two or more, respectively, of polyethylene terephthalate, polyimide, and polyolefin, are stacked on top of each other, the first base film having a thickness of 10 µm to 150 µm.

4. The adhesive tape of claim 2, wherein the first base film contains at least 99 wt % or more of aluminum (Al) and has a tensile strength of 4.8 kgf/mm$^2$ to 14.4 kgf/mm$^2$, an elongation of 6.4% to 19.2%, and a thickness of 20 µm to 80 µm, or the first base film contains at least 99 wt % or more of copper (Cu) and has a tensile strength of 8 kgf/mm$^2$ to 31.2 kgf/mm$^2$, an elongation of 3.2% to 14.4%, and a thickness of 20 µm to 80 µm.

5. The adhesive tape of claim 1, wherein the first adhesive layer contains at least one of a butyl acrylate-butyl methacrylate-methacrylic acid-methyl methacrylate-styrene copolymer, and an acrylic acid-2-ethylhexyl acrylate-2-ethylhexyl methacrylate-glycidyl methacrylate copolymer.

6. The adhesive tape of claim 5, wherein the first adhesive layer is formed by mixing at least one of 25 to 30 parts by weight of a first adhesive composition containing butyl acrylate-butyl methacrylate-methacrylic acid-methyl methacrylate-styrene copolymer, and 70 to 75 parts by weight of ethyl acetate and 25 to 30 parts by weight of a second adhesive composition containing acrylic acid-2-ethylhexyl acrylate-2-ethylhexyl methacrylate-glycidyl methacrylate copolymer, 50 to 55 parts by weight of toluene, and 15 to 20 parts by weight of ethyl acetate, and an epoxy-based hardener, applying the resulting mixture to the first base film, and then drying and hardening the resulting mixture.

7. The adhesive tape of claim 6, wherein the first adhesive layer is formed by mixing 80 to 120 parts by weight of the first adhesive composition and 0.5 to 1.5 parts by weight of the epoxy-based hardener, applying the resulting mixture to the first base film, and then drying and hardening the first base film.

8. The adhesive tape of claim 7, wherein the first adhesive layer is formed by mixing 40 to 60 parts by weight of the first adhesive composition, 40 to 60 parts by weight of the second adhesive composition, and 0.5 to 1.5 parts by weight of the epoxy-based hardener, applying the resulting mixture to the first base film, and drying and hardening the first base film.

9. The adhesive tape of claim 5, wherein the first adhesive layer has a thickness of 100 µm to 700 µm and an adhesive force of at least more than 500 gf/25 mm, and the second adhesive layer has a thickness of 10 µm to 50 µm and an adhesive force of 50 gf/25 mm to 500 gf/25 mm.

10. The adhesive tape of claim 9, wherein the more increased a size of the protrusion electrode, the more decreased the thickness of the first adhesive layer is in a preset thickness range, and the more increased a gap between the protrusion electrodes, the more increased the thickness of the first adhesive layer is in the preset thickness range, and
wherein the more increased the size of the protrusion electrode, the more increased the thickness of the second adhesive layer is in a preset thickness range, and the more increased the gap between the protrusion electrodes, the more decreased the thickness of the second adhesive layer is in the preset thickness range.

11. The adhesive tape of claim 1, wherein the second base film has a thickness of 1 µm to 10 µm.

12. The adhesive tape of claim 1, wherein the second base film contains at least 99 wt % or more of aluminum (Al) and has a tensile strength of 4.8 kgf/mm$^2$ to 14.4 kgf/mm$^2$, an elongation of 6.4% to 19.2%, and a thickness of 10 µm to 35 µm, or the second base film contains at least 99 wt % or more of copper (Cu) and has a tensile strength of 8 kgf/mm$^2$ to 31.2 kgf/mm$^2$, an elongation of 3.2% to 14.4%, and a thickness of 10 µm to 35 µm.

13. A method of manufacturing an adhesive tape for a semiconductor package manufacturing process, the method comprising:
a first tape preparing step of manufacturing a first tape by sequentially stacking a first base film containing a plastic material or a metal material, a first adhesive layer containing an acrylic-based copolymer, and a first release film containing fluorine on top of each other, and manufacturing a second tape by sequentially stacking a second base film containing a metal material, a second adhesive layer containing silicon having a spiral network structure, and a second release film containing fluorine on top of each other; and a first tape lamination step of removing the first release film from the first tape, bringing the first adhesive layer and the second base film into surface contact with each other, and thus laminating the first tape and the second tape on each other.

14. A method of manufacturing an adhesive tape for a semiconductor package manufacturing process, the method comprising:

a second tape preparation step of manufacturing a first tape by sequentially stacking a first base film containing a plastic material or a metal material, a first adhesive layer containing an acrylic-based copolymer, and a first release film containing fluorine on top of each other, manufacturing a third tape by depositing a second base film on a third release film using a metal deposition technique, and manufacturing a fourth tape by sequentially stacking a second adhesive layer containing silicon having a spiral network structure and a second release film containing fluorine on top of each other; and a second tape lamination step of removing the first release film from the first tape, then bringing the first adhesive layer and the second base film of the third tape into surface contact with each other, and laminating the first tape and the third tape on each other, and of removing the third release film from the third tape, then bringing the second base film and the second adhesive layer of the fourth tape into surface contact with each other, and laminating the third tape and the fourth tape on each other.

* * * * *